US006380626B1

(12) United States Patent
Jiang

(10) Patent No.: US 6,380,626 B1
(45) Date of Patent: *Apr. 30, 2002

(54) SEMICONDUCTOR DEVICE FOR ATTACHMENT TO A SEMICONDUCTOR SUBSTRATE

(75) Inventor: Tongbi Jiang, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/516,047

(22) Filed: Mar. 1, 2000

Related U.S. Application Data

(63) Continuation of application No. 08/991,891, filed on Dec. 16, 1997, now Pat. No. 6,051,879.

(51) Int. Cl.[7] ......................... H01L 23/48; H01L 23/52; H01L 29/40

(52) U.S. Cl. ....................... 257/751; 257/750; 257/758; 257/762; 257/763; 257/764; 257/765

(58) Field of Search ................................ 257/751, 750, 257/758, 762, 763, 764, 765; 438/627, 643, 653, 927

(56) References Cited

U.S. PATENT DOCUMENTS

| | | | |
|---|---|---|---|
| 3,106,489 A | 10/1963 | Lepster | 257/751 |
| 4,598,022 A | 7/1986 | Haque et al. | 428/413 |
| 5,074,947 A | 12/1991 | Estes et al. | 156/307 |
| 5,196,371 A | 3/1993 | Kulesza et al. | 437/183 |
| 5,237,130 A | 8/1993 | Kulesza et al. | 174/270 |
| 5,480,834 A | 1/1996 | Lake et al. | 437/183 |
| 5,563,102 A | 10/1996 | Michael | 437/209 |
| 5,583,073 A | 12/1996 | Lin et al. | 439/183 |
| 5,629,564 A | 5/1997 | Nye, III et al. | 257/762 |
| 5,656,858 A | 8/1997 | Kondo et al. | 257/751 |
| 5,708,302 A | 1/1998 | Azuma et al. | 257/751 |
| 6,051,879 A * | 4/2000 | Jiang | 257/751 |

FOREIGN PATENT DOCUMENTS

| | | | |
|---|---|---|---|
| JP | 1-145856 | 6/1989 | 257/751 |
| JP | 2-235372 | 9/1990 | 257/751 |
| JP | 4-27163 | 1/1992 | 257/751 |
| JP | 5-74959 | 3/1993 | 257/751 |
| JP | 6-5599 | 1/1994 | 257/751 |
| WO | 086001640 | 3/1986 | 257/751 |

OTHER PUBLICATIONS

B. Weitzman, "Drawbacks of Copper Interconnects," IEDM Short Course (1996).

Zue Gi et al., "Coordination Polymerization of Benzotriazole on the Surface of Metallic Copper," Chinese J. of Polymer Science, pp. 239–244, vol. 7, No. 3 (1989).

(List continued on next page.)

*Primary Examiner*—Jhihan B Clark
(74) *Attorney, Agent, or Firm*—Workman, Nydegger & Seeley

(57) ABSTRACT

The present invention is an semiconductor device on a semiconductor substrate and a method for forming an semiconductor device on a semiconductor substrate. The semiconductor device in the present invention comprises a first metal layer, a first diffusion barrier layer on the first metal layer, a second metal layer on the first diffusion barrier layer, an organometallic layer on the second metal layer, and an electrical interconnect layer on the organometallic layer. The first diffusion barrier layer prevents diffusion of the first metal layer and the second metal layer therethrough. The organometallic layer is preferably formed by contacting the second metal layer with an organic material to form a organometallic layer. The organometallic layer chemically and physically protects the second metal layer, particularly by preventing the oxidation thereof.

43 Claims, 2 Drawing Sheets

26
10
34
30
22
20 18 32 16
38
38
19
12

OTHER PUBLICATIONS

R. Thomas et al., "Correlation of Surface Wettabililty and Corrosion Rate for Benzotriazole–Treated Copper," J. Electrochem. Soc., pp. 678–685, vol. 139, No. 3 (Mar. 1992).

J. Lau, "Flip–Chip Technologies," p. 228.

H.G. Tompkins et al., "The Interaction of Imidazole, Bensimidazole and Related Azoles with a Copper Surface," pp. 261–266 Surface and Interface Analysis, vol. 4, No. 6 (1982).

G.K. Rao, *Multilevel Interconnect Technology*, pp. 78–95, McGraw–Hill (1993).

W.D. Callister, Jr., *Materials Science and Engineering*, pp. 566–568, John H. Wiley & Son (1994).

R.L. Opila et al., "Thermal Stability of Azole–Coated Copper Surfaces," pp. 4074–4077, J. Electrochem. Soc., vol. 142, No. 12 (Dec. 1995).

Y.Lu et al., "Interfacial Modification for an Aluminum/Epoxy Resin Laminated Composite," pp. 265–274, Composite Interfaces, vol. 2, No. 4 (1994).

K. Cho et al., "An Observation of Benzotriazole (BTA) Adsorption of CU(110)," pp. 125–128, Jpn. J. Appl. Phys., vol. 33 (1994) Pt. 2, No. 1B.

K. Cho et al., "Adsorption and Film Growth of BTA on Clean and Oxygen Adsorbed Cu(110) Surfaces," pp. 380–385, Applied Surface Science 87/88 (1995).

G. Xue et al., "Growth of a Surface Film of Copper from Benzotriazole Solutions," pp. 72–82, Applied Surface Science 98 (1995).

G. Xue et al., "Chemisorption of a Compact Polymeric Coating on Copper Surfaces from a Benzotriazole Solution," pp. 327–332, Applied Surface Science 40 (1990).

S. Gutierrez et al., "Nitrogen Reflow Ovens: The Effect Exit Temperatures has on Benzotriazole Coated Copper Boards," pp. 329–336, 1995 IEEE/CPMT Int/'l Electronics Manufacturing Technology Symp.

* cited by examiner-

SEMICONDUCTOR DEVICE FOR ATTACHMENT TO A SEMICONDUCTOR SUBSTRATE

This application is a continuation of U.S. patent application Ser. No. 08/991,891, filed on Dec. 16, 1997, now U.S. Pat. No. 6,051,879, which is incorporated herein by reference.

BACKGROUND OF THE INVENTION

1. The Field of the Invention

The present invention is directed to an electrical interconnection for attachment to a substrate. More specifically, the present invention is directed to an electrical interconnection between a contact area of a substrate and a contact area of a die and a method of forming the same.

2. Present State of the Art

Integrated circuits have for years been universally used in computer applications, as well as other high-tech applications such as communications and military technologies. A primary concern with integrated circuits has long been the electrical interconnection between the bond pad of a die and the bond pad of a semiconductive substrate. In the context of this document, the term "semiconductive substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term "substrate" refers to any supporting structure including but not limited to the semiconductor substrates described above. In the context of this document, the term "die" is defined as a chip or other electronic component part, either passive or active, discrete or integrated.

Bond pads have typically been used to provide electrically conductive metal contact areas on semiconductor substrates in integrated circuits. Bond pads used in integrated circuits have historically been composed of an aluminum-copper alloy, wherein the copper typically comprises less than about 0.5% of the alloy. Aluminum is an excellent metal for bond pad formation due to its superior adhesion qualities, high thermal stability, and ease of workability (i.e., in etching processes). Although aluminum bond pads are the semiconductor industry standard, aluminum readily oxidizes, even at room temperature, to form aluminum oxide ($Al_2O_3$). Oxides of conductive metals, whether it be aluminum, copper or other conductive metals, sharply increase the contact resistance of the metal and decrease the electrical connection and the efficiency of the bond pad. Hence, while aluminum bond pads exhibit excellent electrical conductivity, unprotected aluminum bond pads readily react to form aluminum oxide which exhibits very high contact resistance and results in a poor interconnection between the bond pad of a die and the bond pad of a substrate.

Several processes have been proposed for removing aluminum oxide from aluminum bond pads in electrical interconnect formation. For instance, it is known to clean aluminum oxide off of aluminum bond pads by sputter-etching in a vacuum tight sputtering chamber and then sputtering a barrier metal, such as TiW, TiN and NiCr, onto the clean aluminum bond pad. A noble metal, such as gold, is then sputtered onto the barrier metal to provide an inert, oxide free surface. While this metallization scheme successfully removes the oxide formed on the aluminum bond pad, this process unfortunately requires the semiconductor die pads and bond pads to be extensively handled. Extensive handling often results in contamination of, and damage to, the electrical connection. Furthermore, the gold plating of the semiconductor die pad is an elaborate process that is difficult, expensive and time consuming.

Another process commonly referred to as the "zincate process" activates the aluminum bond pads using a "zincate solution" and then deposits a layer of nickel and a layer of gold on the bond pad to preserve the electrical connection. The zincate solution, consisting of zinc oxide and sodium hydroxide, dissolves an aluminum oxide formed on the aluminum bond pad to clean the same, and also deposits a thin layer of zinc over the clean aluminum bond pad. A thin nickel phosphorous barrier layer is then deposited over the zinc. A layer of gold is added to the surface of the nickel phosphorous layer to provide an oxide free surface. Although the zincate process effectively reduces the contact resistance stemming from oxide formation, the zincate process is considered to be too expensive for typical mass production processes.

In view of the drawbacks of the presently used electrical interconnection between the bond pad of a chip and the bond pad of a substrate, it is readily apparent that there exists a need for an affordable, reliable, highly conductive electrical interconnection for attachment to a substrate and an affordable method for forming an electrical interconnection for attachment to a substrate.

SUMMARY OF THE INVENTION

In accordance with the invention as embodied and broadly described herein, there is provided an electrical interconnection for attachment to a substrate and a method for forming an electrical interconnection to a substrate. The electrical interconnection in the present invention comprises a first metal layer, a first diffusion barrier layer on the first metal layer, a second metal layer on the first diffusion barrier layer, an organometallic layer on the second metal layer, and an electrical interconnect layer on the organometallic layer.

Once the oxide formed on the first metal layer is removed, a first diffusion barrier layer is formed on the first metal layer. The first diffusion barrier layer prevents diffusion of the first metal layer and the second metal layer therethrough. In a preferred embodiment, the first metal layer is composed of aluminum and the second metal layer is composed of copper. The first diffusion barrier layer prevents the aluminum and the copper from diffusing and adversely effecting the electrical interconnection.

The organometallic layer is preferably formed by contacting the second metal layer with an organic material to form a organometallic layer. The organometallic layer formed is preferably a copper azole such as $Cu^{+}(azole^{-})$ and $Cu^{++}(azole^{-})_2$). The organometallic layer prevents oxidation of the second metal layer which is preferably copper.

The electrical interconnection device of the present invention may be combined with an additional substrate to form an electrical interconnection between a first substrate and a second substrate, for example, as in an integrated circuit. The electrical interconnect of the present invention has a low contact resistance and creates a good electrical interconnect to bond a die to another substrate, such as a supporting substrate.

BRIEF DESCRIPTION OF THE DRAWINGS

In order that the manner in which the above-recited and other advantages and objects of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Figure 1A:
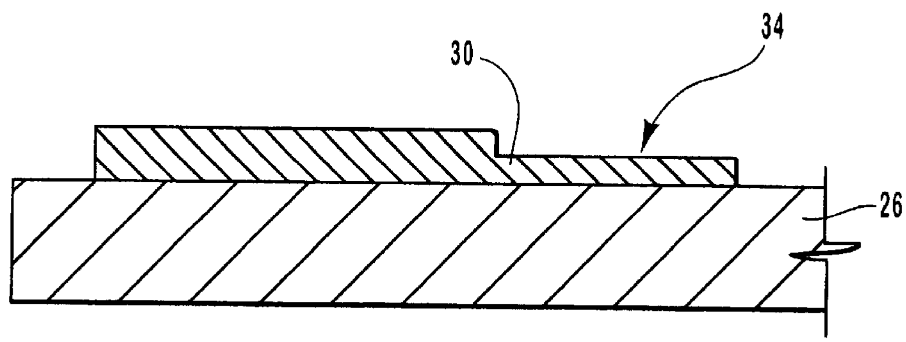
FIG. 1A is cross sectional view of a supporting substrate having a circuit trace.
Figure 1B:
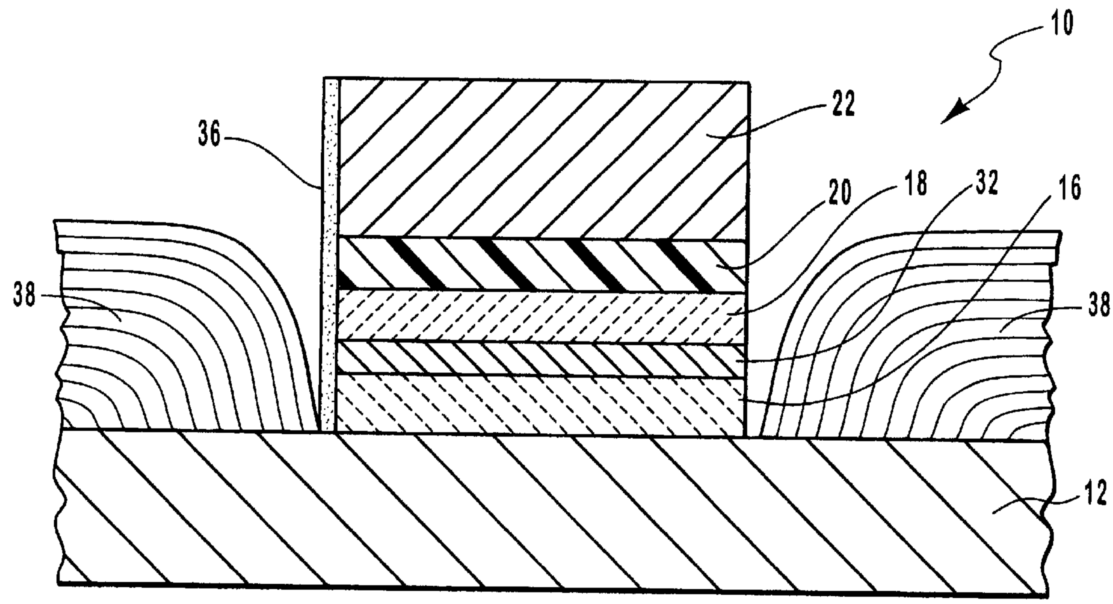
FIG. 1B is cross sectional view of an electrical interconnect on a die substrate.

The present invention is related to an electrical interconnect and a method of forming the same. First and second substrates 12, 26, each of which can be a semiconductive substrate such as a silicon-containing material, are illustrated respectively in FIG. 2 and FIGS. 1A–1C. Second substrate 26 is also referred to herein as a supporting substrate. FIG. 1B illustrates first substrate 12, which can include a chip or die, as having an electrical interconnection 36 affixed thereto. Second substrate 26 typically includes or has fabricated thereon electrical circuitry structures. Second substrate 26 is fabricated to have a circuit trace 30. Circuit trace 30 may be fabricated using any circuit trace technology known in the art, including, but not limited to, copper, aluminum, and printed polymer thick film (copper, silver, or carbon) technologies. A portion of circuit trace 30 is an electrical contact area 34, such as a bond pad. First substrate 12 has thereon a masking or passivation layer 38 to protect the same from the ambient.

First metal layer 16 is on first substrate 12 and is composed of a first metal. A first diffusion barrier layer 32 is on first metal layer 16, and a second metal layer 18 composed of a second metal is on first diffusion barrier layer 32. First diffusion barrier layer 32 prevents diffusion therethrough of either the first metal or the second metal. An organometallic layer 20 is on second metal layer 18, and an electrical interconnect layer 22 is on organometallic layer 20. First substrate 12 may be any supporting structure, including but not limited to a semiconductor substrate. In one embodiment of the present invention, first substrate 12 is a die pad.

First metal layer 16 on first substrate 12 is formed to have an electrical contact area comprising a conducting metal. The electrical contact area is also referred to herein as a bond pad. First metal layer 16 can be formed from any conductive metal, including but not limited to aluminum, copper or an aluminum copper alloy. First metal layer 16 is preferably composed of aluminum. In a more preferred embodiment seen in FIG. 1C, first metal layer 16 is upon and in contact with a second diffusion barrier layer 14 that is upon and in contact with first substrate 12. Second diffusion barrier layer 14 is preferably composed of titanium but can be composed of any material that prevents diffusion therethrough from either first metal layer 16 or first substrate 12.

Second metal layer 18 on first diffusion barrier layer 32 is an electrical conductive metal layer that can be formed from any conductive metal, including but not limited to copper. Second metal layer 18 is formed using any method known in the art, including but not limited to, deposition and photoresistive masking, where the deposition is a method such as physical vapor deposition (PVD), chemical vapor deposition (CVD), and molecular beam epitaxy. Second metal layer 18 is preferably deposited in a vacuum or an inert atmosphere, such as a nitrogen atmosphere, to prevent oxidation of the deposited metal. Second metal layer 18 can have any thickness suitable for use with an electrical interconnection and preferably has a thickness in a range from about 10 nm to about 10 microns.

First diffusion barrier layer 32, situated on first metal layer 16 and below second metal layer 18, is composed of any type of metal that prevents diffusion therethrough of the metal of either first metal layer 16 or second metal layer 18. Hence, the composition of first diffusion barrier layer 32 depends on the compositions of first metal layer 16 and second metal layer 18. In a preferred embodiment, first metal layer 16 is composed of aluminum, second metal layer 18 is composed of copper, and first diffusion barrier layer 32 is a metal selected from the group consisting of nickel (Ni), a refractory metal nitride and a refractory metal tungsten. More preferably, first diffusion barrier layer 32 is selected from the group consisting of titanium tungsten (TiW), titanium nitride (TiN), and nickel (Ni).

Organometallic layer 20 provides mechanical and chemical protection for second metal layer 18. More particularly, a function of organometallic layer 20 is to prevent contamination of second metal layer 18. An additional related function of organometallic layer 20 is to function as a hydrophobic passivation layer preventing corrosion and oxidation of second metal layer 18. Organometallic layer 20 is composed of a metal azole complex, preferably comprising the metal of second metal layer 18 and an azole selected from the group consisting of benzimidazole, 2-methylbenzimidazole, benzotriazole (BTA) and benzotriazole derivatives, such as 5-methylbenzotriazole and 1-methylbenzotriazole, to form organometallic complexes having the general formula $M^{+}(azole^{-})$ and $M^{++}(azole^{-})_2$, depending on the valence of the metal, wherein M represents the metal and the azole is an organic ligand.

In a more preferred embodiment of the present invention, the metal in organometallic layer 20 is formed from second metal layer 18, which is preferably copper, and an organic material, preferably benzotriazole (BTA) or a benzotriazole derivative. Hence, in a preferred embodiment organometallic layer 20 is composed of $Cu^{+}(BTA^{-})$ and $Cu^{++}(BTA^{-})_2$, depending on the valence of the copper. Preferably, organometallic layer 20 has a thickness of below about 30 Angstroms yet thick enough to effectively protect, both physically and chemically, second metal layer 18.

Figure 2:
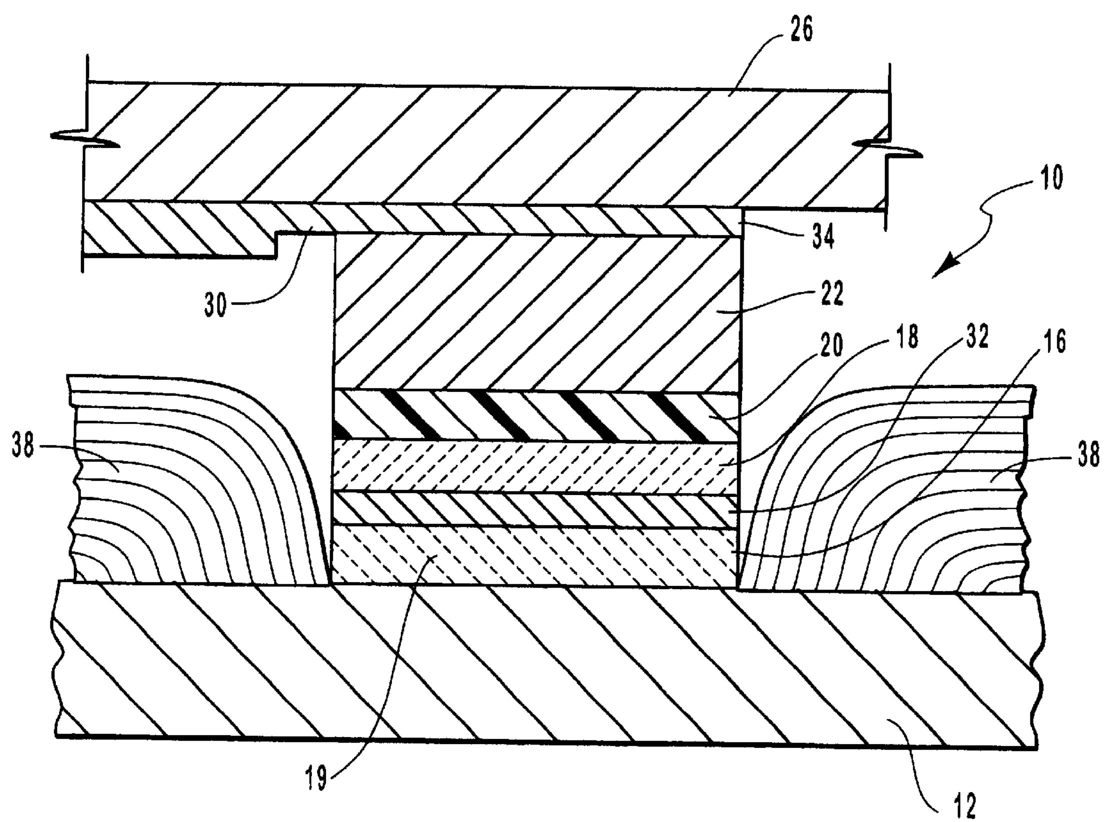
FIG. 2 is cross sectional view of an electronic structure, such as an electronic memory structure including an electrical interconnect between an electric circuit and a supporting substrate.

Electrical interconnect layer 22, seen in FIG. 2, is on organometallic layer 20 and provides electrical contact therewith. When combined with second substrate 26 seen in FIG. 1A, electrical interconnect layer 22 provides an electrical interconnection between an intended electrical contact area of first substrate 12 and an intended electrical contact area of second substrate 26. For example, electrical interconnect layer 22 provides an electrical interconnection between contact area 34 of first substrate 12 and a contact area on first metal layer 16 of second substrate 26. Electrical interconnect layer 22 can be any electrical conducting material, including but not limited to electrically conductive material that is formed into epoxy bumps or solder connects as is known in the semiconductor chip packaging arts. Epoxy bumps can be formed by any known process commonly used in the art and can be made from any type of base resin material that is compatible with the electrical interconnect. The base resin material in electrical interconnect layer 22 further comprises electrical conducting particles, including but not limited to silver particles and preferably nickel particles. Solder interconnects are well-known in the art and any compatible solder can be used to form electrical interconnect layer 22.

Electrical interconnect layer 22 can be combined with the second substrate 26, also referred to herein as supporting substrate 26, having circuit trace 30 to form a memory module 50 as illustrated in FIG. 2. Contact area 34, also referred to as a third metal layer 34, on supporting substrate 26 is aligned with first metal layer 16. The structure including supporting substrate 26 seen in FIG. 1A, when combined and connected with device 10 seen in FIG. 1B form a memory module seen in FIG. 2. In FIG. 2, it is intended that first substrate 12 represent a structure including a memory device, such as a ROM, RAM, DRAM, and other such memory devices, as are embodied in a chip or die. It is also intended that FIG. 2 be representative of the combined structures illustrate in FIG. 1A with either FIG. 1B or FIG. 1C. As such structure 19 in FIG. 2 is intended to be a layered structure combining combination of first metal layer 16 upon second diffusion barrier layer 14 which is upon first substrate 12

Electrical interconnect layer 22 is interposed between first and second substrates 12, 26. In one embodiment, a small amount of a wet epoxy, such as conductive epoxy, is added to contact area 34 to combine supporting substrate 26 with the multiple layers upon first substrate 12. The conductive adhesive is cured so as to affix together first and second substrates 12, 26. In still another embodiment, a thermal plastic epoxy is applied to third metal layer 34 or contact area 34. Second substrate 26 is then attached to first substrate 12 application of pressure and heat. A wire bond may then be used to electrically connect second substrate 26 to an external electrical connection.

Third metal layer 34 or contact area 34 on second substrate 26 can be a die pond pad, and is preferably composed of any conducting metal, including but not limited to aluminum, copper, and aluminum copper alloys. As shown, electrical interconnect layer 22 is in contact with third metal layer 34 or contact area 34.

A method of forming an electrical interconnection to first substrate 12 comprises providing first metal layer 16 on first substrate 12. First metal layer 16 is composed of a first metal, which is preferably electrically conductive, such as aluminum, copper, or an aluminum copper alloy. First metal layer 16 is an electrical contact area, also referred to as a bond pad. In a preferred embodiment, first metal layer 16 is composed of aluminum. Conductive metals used to form first metal layer 16 typically oxidize in ambient conditions. As mentioned above, oxidized metal, such as aluminum oxide, increases contact resistance and adversely effects the electrical connection of associated electrical contact areas.

Figure 1C:
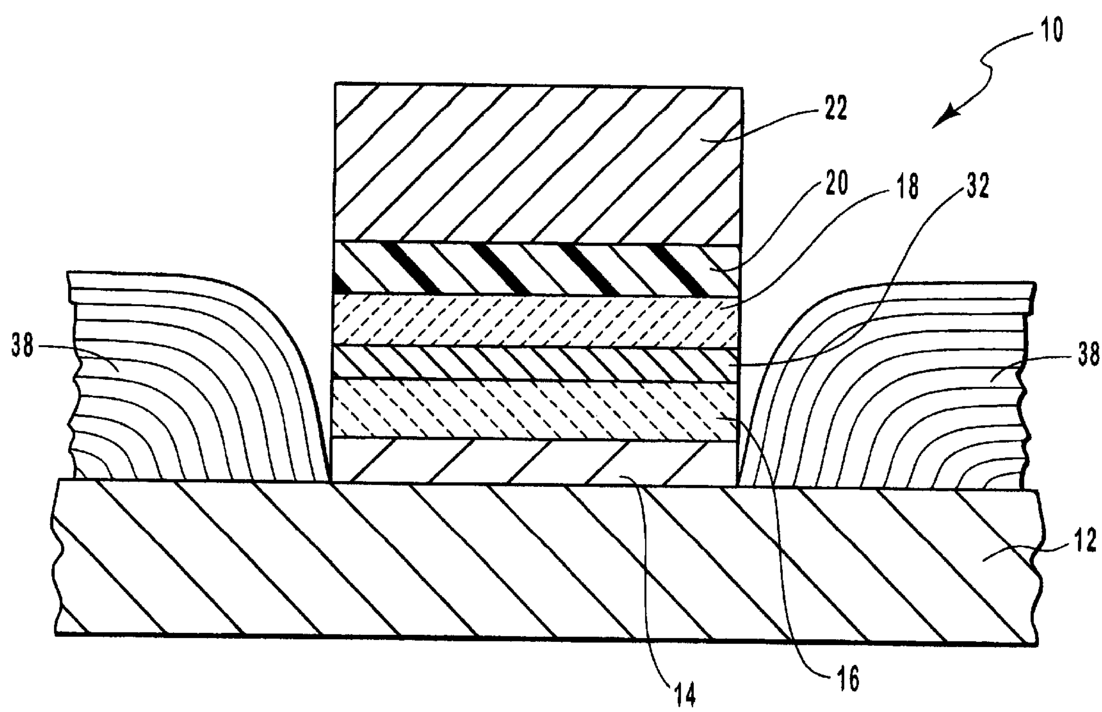
FIG. 1C is cross sectional view of an electrical interconnect on a die substrate, wherein a first metal layer includes a second diffusion layer on a first substrate.

As seen in FIG. 1C, the method may also include forming second diffusion barrier layer 14 upon and in contact with first substrate 12, and then forming first metal layer 16 upon and in contact with second barrier layer 14.

The present method includes removing the metal oxide from first metal layer 16. Hence, when first metal layer 16 is composed of aluminum, the method comprises removing the aluminum oxide formed on first metal layer 16. The metal oxide can be removed by any standard method known in the art, including but not limited to a wet etch method, reactive ion etching (including plasma enhanced reactive ion etching) and mechanical abrasion. Oxide removal is preferably performed in an inert atmosphere to avoid further oxidation. Once the oxide has been cleaned from first metal layer 16, first diffusion barrier layer 32 is formed on a cleaned surface of first metal layer 16.

After forming first diffusion barrier layer 32 on first metal layer 16, a second metal layer 18 is formed on first diffusion barrier layer 32 using any known method, including but not limited to photoresistive masking and deposition processes such as physical vapor deposition, chemical vapor deposition, and molecular beam epitaxy. Diffusion barrier layer prevents diffusion therethrough of either the first metal of first metal layer 16 or the second metal of second metal layer 18. Second metal layer 18 is preferably deposited in a vacuum or an inert atmosphere, such as a nitrogen environment, to prevent oxidation of second metal layer 18.

After second metal layer 18 is formed, organometallic layer 20 is formed on second metal layer 18 by contacting a metal with an azole that readily reacts with second metal layer 18. Organometallic layer 20 typically has the formula $M^{+}(azole^{-})$, $M^{++}(azole^{-})_2$. In a preferred embodiment, organometallic layer 20 is formed on second metal layer 18 by immersing second metal layer 18 in a solution comprising an azole in a non-corrosive solution to form organometallic layer 20. For example, a copper second metal layer 18 can be is immersed in a 2% benzotriazole (BTA) ethanol solution at 50° C. for about five minutes in an inert environment to form a thin layer of the organometallic material, $Cu^{+}(BTA^{-})$ and $Cu^{++}(BTA^{-})_2$.

Examples of organometallic layers formed from copper and azoles and examples of processes for forming organometallic can be found in The Interaction of Imidazole, Benzimidazole and Related Azoles with a Copper Surface, H. G. Tompkins et al., Surface and Interface Analysis, Vol. 4, No. 6, 1982; Coordination Polymerization of Benzotriazole on the Surface of Metallic Copper, Gi Xue et al., Chinese Journal of Polymer Science, Vol. 7, No. 3, 1989; and Correlation of Surface Wettability and Corrosion Rate for Benzotriazole-Treated Copper, Richard R. Thomas et al., The Electrochemical Society, Inc., Vol. 139, No. 3, March 1992, which are herein incorporated by reference.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A semiconductor device on a semiconductor substrate comprising:

a first metal layer on the semiconductor substrate, the first metal layer being composed of a first metal;

a first diffusion barrier layer on the first metal layer;

a second metal layer composed of a second metal and situated on the first diffusion barrier layer;

an organometallic layer, composed of a metal azole complex, on the second metal layer; and an electrical interconnect layer on the organometallic layer.

2. A semiconductor device on a semiconductor substrate as recited in claim 1, wherein the first metal layer is upon and in contact with a second diffusion barrier layer, said second diffusion barrier layer being upon and in contact with the semiconductor substrate and prevents diffusion of either the semiconductor substrate or the first metal layer therethrough.

3. A semiconductor device on a semiconductor substrate as recited in claim 1, wherein the first metal layer is composed of an electrical conducting metal selected from the group consisting of aluminum, copper, and an aluminum copper alloy.

4. A semiconductor device on a semiconductor substrate as recited in claim 1, wherein the first metal layer is composed of aluminum.

5. A semiconductor device on a semiconductor substrate as recited in claim 1, wherein the first diffusion barrier layer is composed of a metal selected from the group consisting of nickel, a refractory metal nitride and a refractory metal tungsten.

6. A semiconductor device on a semiconductor substrate as recited in claim 1, wherein the first diffusion barrier layer is composed of a metal selected from the group consisting of titanium tungsten, titanium nitride, and nickel.

7. A semiconductor device on a semiconductor substrate as recited in claim 1, wherein the second metal layer is composed of copper.

8. A semiconductor device on a semiconductor substrate as recited in claim 1, wherein the second metal layer has a thickness in a range from about 10 nm to about 10 microns.

9. A semiconductor device on a semiconductor substrate as recited in claim 1, wherein the metal forming the metal azole complex is a portion of the second metal layer.

10. A semiconductor device on a semiconductor substrate as recited in claim 9, wherein the second metal layer is composed of copper.

11. A semiconductor device on a semiconductor substrate as recited in claim 1, wherein the azole forming the metal azole complex is selected from the group consisting of benzimidazole, 2-methylbenzimidazole, benzotriazole, derivatives and mixtures thereof.

12. A semiconductor device on a semiconductor substrate as recited in claim 1, wherein the organometallic layer is composed of an organometallic material selected from the group consisting of $Cu^{+}(BTA^{-})$ and $Cu^{++}(BTA^{-})_2$.

13. A semiconductor device on a semiconductor substrate as recited in claim 1, wherein the electrical interconnect layer is composed of an electrical conductive material selected from the group consisting of an electrically conductive epoxy and an electrically solder material.

14. A semiconductor device on a semiconductor substrate as recited in claim 1, wherein the electrical interconnect layer is composed of a base resin material having electrical conducting particles selected from the group consisting of silver particles and nickel particles.

15. A semiconductor device on a semiconductor substrate as recited in claim 1, wherein the organometallic layer has a thickness less than about 30 Angstroms.

16. A semiconductor device on a semiconductor substrate comprising:

a first metal layer on the semiconductor substrate composed of a first metal;

a first diffusion barrier layer on the first metal contact layer;

a second diffusion barrier layer upon and in contact with the semiconductor substrate, wherein the first metal layer is upon and in contact with the second diffusion barrier layer, and wherein the second diffusion barrier layer prevents diffusion of either the semiconductor substrate or the first metal layer therethrough;

a second metal layer composed of a second metal and situated on the first diffusion barrier layer, the first diffusion barrier layer preventing diffusion of either the first metal or the second metal therethrough;

an organometallic layer on the second metal layer;

an electrical interconnect layer on the organometallic layer; and a third metal layer on the electrical interconnect layer.

17. A semiconductor device on a semiconductor substrate as recited in claim 16, further comprising a second substrate on the third metal layer.

18. A semiconductor device on a semiconductor substrate as recited in claim 16, wherein the third metal layer is composed of an electrical conducting metal selected from the group consisting of aluminum, copper and an aluminum copper alloy.

19. A semiconductor device on a semiconductor substrate as recited in claim 16, wherein the second diffusion barrier layer is composed of titanium, the first metal layer is composed of a material selected from a group consisting of aluminum, copper or an aluminum copper alloy, and the semiconductor substrate is composed of a silicon-containing material.

20. A semiconductor device on a semiconductor substrate comprising:

a first metal layer on the semiconductor substrate comprising aluminum;

a first diffusion barrier layer on the first metal layer;

a second metal layer on the first diffusion barrier layer comprising copper, the first diffusion barrier layer preventing diffusion of either aluminum or copper therethrough;

an organometallic layer on the second metal layer comprising a copper azole complex; and an electrical interconnect layer, composed of an electrical conductive material selected from the group consisting of an electrically conductive epoxy and an electrically solder material, on the organometallic layer.

21. A semiconductor device on a semiconductor substrate as recited in claim 20, wherein the first diffusion barrier layer is composed of a metal selected from the group consisting of nickel, titanium tungsten and titanium nitride.

22. A semiconductor device on a semiconductor substrate as recited in claim 20, wherein the first metal layer is upon and in contact with a second diffusion barrier layer that is upon and in contact with the semiconductor substrate, wherein the second diffusion barrier layer prevents diffusion of either the semiconductor substrate or the first metal layer therethrough.

23. A semiconductor device on a semiconductor substrate as recited in claim 22, wherein the second diffusion barrier layer is composed of titanium, the first metal layer is composed of a material selected from a group consisting of aluminum, copper or an aluminum copper alloy, and the semiconductor substrate is composed of a silicon-containing material.

24. A semiconductor device comprising:

a first semiconductor substrate including an electronic circuit;

a first metal layer upon the first semiconductor substrate;

a first diffusion barrier layer upon the first metal layer;

a second metal layer on said first diffusion barrier layer, the first diffusion barrier layer preventing diffusion of either the first metal or the second metal therethrough;

an organometallic layer on the second metal layer; and an electrical interconnect layer on the organometallic layer;

wherein:

said first metal layer is composed of aluminum;

said first diffusion barrier layer is composed of a material selected from a group consisting of nickel (Ni), a refractory metal nitride and a refractory metal tungsten;

said second metal layer is composed of copper and has a thickness in a range from about 10 nm to about 10 microns;

said organometallic layer is composed of a metal azole complex, having the general formula $M^{+}(azole^{-})$ or $M^{++}(azole^{-})_2$, wherein M represents the metal and the azole is an organic ligand; and said electrical interconnect layer is composed of electrical conducting particles including at least one of silver particles and nickel particles.

25. A semiconductor device comprising:

a first semiconductor substrate including an electronic circuit;

a first metal layer upon the first semiconductor substrate;

a first diffusion barrier layer upon the first metal layer;

a second metal layer on said first diffusion barrier layer, the first diffusion barrier layer preventing diffusion of either the first metal or the second metal therethrough;

an organometallic layer on the second metal layer;

an electrical interconnect layer on the organometallic layer;

a third metal layer on the electrical interconnect layer and having a contact area thereon interfacing with the electrical interconnect layer; and a second substrate upon said third metal layer.

26. The semiconductor device as defined in claim 25, further comprising a passivation layer on the first semiconductor substrate.

27. A semiconductor device comprising:

a first semiconductor substrate including an electronic circuit;

a second diffusion barrier layer upon the first semiconductor substrate;

a first metal layer upon the second diffusion barrier layer, the second diffusion barrier layer preventing diffusion of either the first semiconductor substrate or the first metal therethrough;

a first diffusion barrier layer upon the first metal layer;

a second metal layer on first diffusion barrier layer, the first diffusion barrier layer preventing diffusion of either the first metal layer or the second metal layer therethrough;

an organometallic layer on the second metal layer; and an electrical interconnect layer on the organometallic layer.

28. The semiconductor device as defined in claim 27, further comprising a third metal layer on the electrical interconnect layer and having a contact area thereon interfacing with the electrical interconnect layer; and a second substrate upon said third metal layer.

29. The semiconductor device as defined in claim 27, further comprising a passivation layer on the first semiconductor substrate.

30. The semiconductor device as defined in claim 27, wherein:

said first metal layer is composed of aluminum;

said second diffusion barrier layer is composed of titanium;

said first diffusion barrier layer is composed of a material selected from a group consisting of nickel, a refractory metal nitride, and a refractory metal tungsten;

said second metal layer is composed of copper and has a thickness in a range from about 10 nm to about 10 microns;

said organometallic layer is composed of a metal azole complex, having the general formula $M^{+}(azole^{-})$ or $M^{++}(azole^{-})_2$, wherein M represents the metal and the azole is an organic ligand; and said electrical interconnect layer is composed of electrical conducting particles including at least one of silver particles and nickel particles.

31. A semiconductor device on a semiconductor substrate comprising:

a first metal layer on the semiconductor substrate, the first metal layer being composed of a first metal;

a first diffusion barrier layer on the first metal layer;

a second diffusion barrier layer upon and in contact with the semiconductor substrate, wherein the first metal layer is upon and in contact with the second diffusion barrier layer, said second diffusion barrier layer preventing diffusion of either the semiconductor substrate or the first metal layer therethrough;

a second metal layer composed of a second metal and situated on the first diffusion barrier layer;

an organometallic layer on the second metal layer; and an electrical interconnect layer on the organometallic layer.

32. A semiconductor device on a semiconductor substrate as recited in claim 31, wherein the second diffusion barrier layer is composed of titanium, the first metal layer is composed of a material selected from a group consisting of aluminum, copper or an aluminum copper alloy, and the semiconductor substrate is composed of a silicon-containing material.

33. A semiconductor device on a semiconductor substrate as recited in claim 31, wherein the second diffusion layer is composed of titanium.

34. A semiconductor device on a semiconductor substrate as recited in claim 31, wherein the first metal layer is composed of an electrical conducting metal selected from the group consisting of aluminum, copper, and an aluminum copper alloy.

35. A semiconductor device on a semiconductor substrate as recited in claim 31, wherein the first metal layer is composed of aluminum.

36. A semiconductor device on a semiconductor substrate as recited in claim 31, wherein the first diffusion barrier layer is composed of a metal selected from the group consisting of nickel, a refractory metal nitride and a refractory metal tungsten.

37. A semiconductor device on a semiconductor substrate as recited in claim 31, wherein the first diffusion barrier layer is composed of a metal selected from the group consisting of titanium tungsten, titanium nitride, and nickel.

38. A semiconductor device on a semiconductor substrate as recited in claim 31, wherein the second metal layer is composed of copper.

39. A semiconductor device on a semiconductor substrate as recited in claim 31, wherein the second metal layer has a thickness in a range from about 10 nm to about 10 microns.

40. A semiconductor device on a semiconductor substrate as recited in claim 31, wherein the organometallic layer is composed of an organometallic material selected from the group consisting of $Cu^{+}(BTA^{-})$ and $Cu^{++}(BTA^{-})_2$.

41. A semiconductor device on a semiconductor substrate as recited in claim 31, wherein the electrical interconnect layer is composed of an electrical conductive material selected from the group consisting of an electrically conductive epoxy and an electrically solder material.

42. A semiconductor device on a semiconductor substrate as recited in claim 31, wherein the electrical interconnect layer is composed of a base resin material having electrical conducting particles selected from the group consisting of silver particles and nickel particles.

43. A semiconductor device on a semiconductor substrate as recited in claim 31, wherein the organometallic layer has a thickness less than about 30 Angstroms.

* * * * *

UNITED STATES PATENT AND TRADEMARK OFFICE

CERTIFICATE OF CORRECTION

PATENT NO. : 6,380,626 B1
DATED : April 30, 2002
INVENTOR(S) : Tongbi Jiang

It is certified that error appears in the above-identified patent and that said Letters Patent is hereby corrected as shown below:

Title page,
Item [56], OTHER PUBLICATIONS, insert -- J.D. DeBiase, "Surface Finishes," p. 38, SMT (June 1997). --

Column 6,
Line 13, after "layer" insert -- 32 --

Signed and Sealed this

Tenth Day of December, 2002

JAMES E. ROGAN
*Director of the United States Patent and Trademark Office*